United States Patent
Reddy et al.

(10) Patent No.: US 9,917,507 B2
(45) Date of Patent: Mar. 13, 2018

(54) DYNAMIC CLOCK PERIOD MODULATION SCHEME FOR VARIABLE CHARGE PUMP LOAD CURRENTS

(71) Applicant: SanDisk Technologies LLC, Plano, TX (US)

(72) Inventors: Gooty Sukumar Reddy, Anantapur (IN); Potnuru Venkata Pradeep Kumar, Visakhapatnam (IN); Sridhar Yadala, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/724,067

(22) Filed: May 28, 2015

(65) Prior Publication Data

US 2016/0352217 A1    Dec. 1, 2016

(51) Int. Cl.
| | | |
|---|---|---|
| H03K 3/03 | (2006.01) | |
| H02M 3/07 | (2006.01) | |
| H03K 3/354 | (2006.01) | |
| H02M 1/44 | (2007.01) | |
| H02M 1/08 | (2006.01) | |
| H03K 17/687 | (2006.01) | |

(Continued)

(52) U.S. Cl.
CPC ............... *H02M 3/07* (2013.01); *H02M 1/08* (2013.01); *H02M 1/44* (2013.01); *H02M 3/00* (2013.01); *H03K 3/0231* (2013.01); *H03K 3/354* (2013.01); *H03K 17/687* (2013.01); *H03L 7/18* (2013.01); *H02M 2001/0003* (2013.01)

(58) Field of Classification Search
CPC ...... H03K 3/0231; H03K 17/687; H03L 7/18; H02M 1/44; H02M 3/07; H02M 2001/0032; H02M 3/00; H02M 1/08
USPC ....... 327/536, 589, 534; 363/74; 331/17, 16, 331/34, 111, 143, 183, 57
See application file for complete search history.

(56) References Cited

U.S. PATENT DOCUMENTS

| | | |
|---|---|---|
| 3,697,860 A | 10/1972 | Donal |
| 4,271,461 A | 6/1981 | Hoffmann et al. |

(Continued)

FOREIGN PATENT DOCUMENTS

| | | |
|---|---|---|
| CN | 101764518 A | 6/2010 |
| CN | 101882928 A | 11/2010 |

(Continued)

OTHER PUBLICATIONS

Ang et al., "An On-Chip Voltage Regulator Using Switched Decoupling Capacitors," Feb. 2000 IEEE International Solid-State Circuits Conference, 2 pages.

(Continued)

*Primary Examiner* — Arnold Kinkead
(74) *Attorney, Agent, or Firm* — Stoel Rives LLP

(57) ABSTRACT

A charge pump is connected to receive a supply voltage and a clock signal and generate an output voltage. The charge pump is connected to the supply voltage through a transistor whose gate voltage is set by a regulation voltage determined by feedback from the output voltage. The current supplied to the charge pump through this transistor is mirrored in a section that generates the clock signal, where the mirrored current is used by a current controller oscillator. This allows the pump's clock frequency to linearly track the load current, improving the pump's efficiency.

21 Claims, 9 Drawing Sheets

(51) Int. Cl.
  *H02M 3/00* (2006.01)
  *H03L 7/18* (2006.01)
  *H03K 3/0231* (2006.01)
  *H02M 1/00* (2006.01)

(56) References Cited

U.S. PATENT DOCUMENTS

| | | |
|---|---|---|
| 4,511,811 A | 4/1985 | Gupta |
| 4,583,157 A | 4/1986 | Kirsch et al. |
| 4,621,315 A | 11/1986 | Vaughn et al. |
| 4,636,748 A | 1/1987 | Paul |
| 4,736,121 A | 4/1988 | Cini et al. |
| 4,888,738 A | 12/1989 | Wong et al. |
| 5,140,182 A | 8/1992 | Ichimura |
| 5,168,174 A | 12/1992 | Naso et al. |
| 5,175,706 A | 12/1992 | Edme |
| 5,263,000 A | 11/1993 | Buskirk et al. |
| 5,335,198 A | 8/1994 | Buskirk et al. |
| 5,392,205 A | 2/1995 | Zavaleta |
| 5,432,469 A | 7/1995 | Tedrow et al. |
| 5,436,587 A | 7/1995 | Cernea |
| 5,483,434 A | 1/1996 | Seesink |
| 5,508,971 A | 4/1996 | Cernea |
| 5,521,547 A | 5/1996 | Tsukada |
| 5,539,351 A | 7/1996 | Gilsdorf et al. |
| 5,553,030 A | 9/1996 | Tedrow et al. |
| 5,563,779 A | 10/1996 | Cave et al. |
| 5,563,825 A | 10/1996 | Cernea et al. |
| 5,568,424 A | 10/1996 | Cernea et al. |
| 5,570,315 A | 10/1996 | Tanaka et al. |
| 5,592,420 A | 1/1997 | Cernea et al. |
| 5,596,532 A | 1/1997 | Cernea et al. |
| 5,602,794 A | 2/1997 | Javanifard et al. |
| 5,621,685 A | 4/1997 | Cernea et al. |
| 5,625,544 A | 4/1997 | Kowshik |
| 5,635,776 A | 6/1997 | Imi |
| 5,644,534 A | 7/1997 | Soejima |
| 5,693,570 A | 12/1997 | Cernea et al. |
| 5,712,778 A | 1/1998 | Moon |
| 5,732,039 A | 3/1998 | Javanifard et al. |
| 5,734,286 A | 3/1998 | Takeyama et al. |
| 5,734,290 A | 3/1998 | Chang et al. |
| 5,767,735 A | 6/1998 | Javanifard et al. |
| 5,781,473 A | 7/1998 | Javanifard et al. |
| 5,801,987 A | 9/1998 | Dinh |
| 5,812,017 A | 9/1998 | Golla et al. |
| 5,818,766 A | 10/1998 | Song |
| 5,828,596 A | 10/1998 | Takata et al. |
| 5,903,495 A | 5/1999 | Takeuchi et al. |
| 5,943,226 A | 8/1999 | Kim |
| 5,945,870 A | 8/1999 | Chu et al. |
| 5,969,565 A | 10/1999 | Naganawa |
| 5,969,988 A | 10/1999 | Tanzawa et al. |
| 5,973,546 A | 10/1999 | Le et al. |
| 5,978,283 A | 10/1999 | Hsu et al. |
| 5,982,222 A | 11/1999 | Kyung |
| 6,008,690 A | 12/1999 | Takeshima et al. |
| 6,011,440 A | 1/2000 | Bell et al. |
| 6,016,073 A | 1/2000 | Ghilardelli et al. |
| 6,023,187 A | 2/2000 | Camacho et al. |
| 6,026,002 A | 2/2000 | Viehmann |
| 6,018,264 A | 7/2000 | Jin et al. |
| 6,100,557 A | 8/2000 | Hung et al. |
| 6,104,225 A | 8/2000 | Taguchi et al. |
| 6,107,862 A | 8/2000 | Mukainakano et al. |
| 6,134,145 A | 10/2000 | Wong |
| 6,147,566 A | 11/2000 | Pizzuto et al. |
| 6,151,229 A | 11/2000 | Taub et al. |
| 6,154,088 A | 11/2000 | Chevallier et al. |
| 6,157,242 A | 12/2000 | Fukui et al. |
| 6,188,590 B1 | 2/2001 | Chang et al. |
| 6,198,645 B1 | 3/2001 | Kotowski et al. |
| 6,208,198 B1 | 3/2001 | Lee |
| 6,249,445 B1 | 6/2001 | Sugasawa |
| 6,249,898 B1 | 6/2001 | Koh et al. |
| 6,272,029 B1 | 8/2001 | Hirose |
| 6,275,096 B1 | 8/2001 | Hsu et al. |
| 6,278,294 B1 | 8/2001 | Taniguchi |
| 6,285,622 B1 | 9/2001 | Haraguchi et al. |
| 6,288,601 B1 | 9/2001 | Tomishima |
| 6,297,687 B1 | 10/2001 | Sugimura |
| 6,307,425 B1 | 10/2001 | Chevallier et al. |
| 6,314,025 B1 | 11/2001 | Wong |
| 6,320,428 B1 | 11/2001 | Atsumi et al. |
| 6,320,796 B1 | 11/2001 | Voo |
| 6,320,797 B1 | 11/2001 | Liu |
| 6,329,869 B1 | 12/2001 | Matano |
| 6,333,873 B1 | 12/2001 | Kumanoya et al. |
| 6,341,087 B1 | 1/2002 | Kunikiyo |
| 6,344,959 B1 | 2/2002 | Milazzo |
| 6,344,984 B1 | 2/2002 | Miyazaki |
| 6,356,062 B1 | 3/2002 | Elmhurst et al. |
| 6,356,499 B1 | 3/2002 | Banba et al. |
| 6,359,798 B1 | 3/2002 | Han et al. |
| 6,369,642 B1 | 4/2002 | Zeng |
| 6,370,075 B1 | 4/2002 | Haeberli et al. |
| 6,385,107 B1 | 5/2002 | Bedarida et al. |
| 6,400,202 B1 | 6/2002 | Fifield et al. |
| 6,404,274 B1 | 6/2002 | Hosono et al. |
| 6,411,157 B1 | 6/2002 | Hsu et al. |
| 6,424,570 B1 | 7/2002 | Le et al. |
| 6,445,243 B2 | 9/2002 | Myono |
| 6,456,154 B2 | 9/2002 | Sugimura |
| 6,456,170 B1 | 9/2002 | Segawa et al. |
| 6,476,666 B1 | 11/2002 | Palusa et al. |
| 6,486,728 B2 | 11/2002 | Kleveland |
| 6,501,325 B1 | 12/2002 | Meng |
| 6,518,830 B2 | 2/2003 | Gariboldi et al. |
| 6,522,191 B1 | 2/2003 | Cha |
| 6,525,614 B2 | 2/2003 | Tanimoto |
| 6,525,949 B1 | 2/2003 | Johnson et al. |
| 6,531,792 B2 | 3/2003 | Oshio |
| 6,538,930 B2 | 3/2003 | Ishii et al. |
| 6,545,529 B2 | 4/2003 | Kim |
| 6,556,465 B2 | 4/2003 | Haeberli et al. |
| 6,577,535 B2 | 6/2003 | Pasternak |
| 6,606,267 B2 | 8/2003 | Wong |
| 6,661,682 B2 | 12/2003 | Kim et al. |
| 6,703,891 B2 | 3/2004 | Tanaka et al. |
| 6,724,241 B1 | 4/2004 | Bedarida et al. |
| 6,734,718 B1 | 5/2004 | Pan |
| 6,737,887 B2 | 5/2004 | Forbes et al. |
| 6,737,907 B2 | 5/2004 | Hsu et al. |
| 6,760,262 B2 | 7/2004 | Haeberli et al. |
| 6,762,640 B2 | 7/2004 | Katsuhisa |
| 6,781,440 B2 | 8/2004 | Huang |
| 6,798,274 B2 | 9/2004 | Tanimoto |
| 6,819,162 B2 | 11/2004 | Pelliconi |
| 6,834,001 B2 | 12/2004 | Myono |
| 6,841,981 B2 | 1/2005 | Smith et al. |
| 6,859,091 B1 | 2/2005 | Nicholson |
| 6,878,981 B2 | 4/2005 | Eshel |
| 6,891,764 B2 | 5/2005 | Li |
| 6,894,554 B2 | 5/2005 | Ito |
| 6,922,096 B2 | 7/2005 | Cernea |
| 6,927,441 B2 | 8/2005 | Pappalardo et al. |
| 6,933,768 B2 | 8/2005 | Hasumann |
| 6,944,058 B2 | 9/2005 | Wong |
| 6,954,386 B2 | 10/2005 | Narui et al. |
| 6,975,135 B1 | 12/2005 | Bui |
| 6,985,397 B2 | 1/2006 | Tokui |
| 6,990,031 B2 | 1/2006 | Hashimoto et al. |
| 6,995,603 B2 | 2/2006 | Chen et al. |
| 6,999,327 B2 | 2/2006 | Smith et al. |
| 7,002,381 B1 | 2/2006 | Chung |
| 7,023,260 B2 | 4/2006 | Thorp et al. |
| 7,030,683 B2 | 4/2006 | Pan et al. |
| 7,046,076 B2 | 5/2006 | Daga et al. |
| 7,092,263 B2 | 8/2006 | Chang |
| 7,113,023 B2 | 9/2006 | Cernea |
| 7,116,154 B2 | 10/2006 | Guo |
| 7,116,155 B2 | 10/2006 | Pan |
| 7,119,624 B2 | 10/2006 | Gomez |
| 7,120,051 B2 | 10/2006 | Gorobets et al. |

(56) References Cited

U.S. PATENT DOCUMENTS

| | | | |
|---|---|---|---|
| 7,123,078 B2 | 10/2006 | Seo |
| 7,129,538 B2 | 10/2006 | Lee et al. |
| 7,129,759 B2 | 10/2006 | Fukami |
| 7,135,910 B2 | 11/2006 | Cernea |
| 7,135,911 B2 | 11/2006 | Imamiya |
| 7,135,934 B2 | 11/2006 | Sanchez et al. |
| 7,145,382 B2 | 12/2006 | Ker et al. |
| 7,180,794 B2 | 2/2007 | Matsue |
| 7,205,682 B2 | 4/2007 | Kuramori |
| 7,208,996 B2 | 4/2007 | Suzuki et al. |
| 7,215,179 B2 | 5/2007 | Yamazoe et al. |
| 7,224,591 B2 | 5/2007 | Kaishita et al. |
| 7,227,780 B2 | 6/2007 | Komori et al. |
| 7,239,192 B2 | 7/2007 | Tailliet |
| 7,253,675 B2 | 8/2007 | Aksin et al. |
| 7,253,676 B2 | 8/2007 | Fukuda et al. |
| 7,259,612 B2 | 8/2007 | Saether |
| 7,276,960 B2 | 10/2007 | Peschke |
| 7,279,957 B2 | 10/2007 | Yen |
| 7,345,335 B2 | 3/2008 | Watanabe |
| 7,348,829 B2 | 3/2008 | Choy et al. |
| 7,368,979 B2 | 5/2008 | Govindu et al. |
| 7,382,176 B2 | 6/2008 | Ayres et al. |
| 7,391,630 B2 | 6/2008 | Acantinei |
| 7,397,677 B1 | 7/2008 | Collins et al. |
| 7,436,241 B2 | 10/2008 | Chen et al. |
| 7,466,188 B2 | 12/2008 | Fifield |
| 7,468,628 B2 | 12/2008 | Im et al. |
| 7,495,471 B2 | 2/2009 | Perisetty |
| 7,495,500 B2 | 2/2009 | Al-Shamma et al. |
| 7,515,488 B2 | 4/2009 | Thorp et al. |
| 7,521,978 B2 | 4/2009 | Kim et al. |
| 7,554,311 B2 | 6/2009 | Pan |
| 7,558,129 B2 | 7/2009 | Thorp et al. |
| 7,579,902 B2 | 8/2009 | Frulio et al. |
| 7,579,903 B2 | 8/2009 | Oku |
| 7,586,362 B2 | 9/2009 | Pan et al. |
| 7,602,233 B2 | 10/2009 | Pietri et al. |
| 7,667,529 B2 | 2/2010 | Consuelo et al. |
| 7,671,572 B2 | 3/2010 | Chung |
| 7,683,700 B2 | 3/2010 | Huynh et al. |
| 7,696,812 B2 | 4/2010 | Al-Shamma et al. |
| 7,702,043 B2 | 4/2010 | Smith et al. |
| 7,741,898 B2 | 6/2010 | Hsu |
| 7,742,358 B2 | 6/2010 | Nakai et al. |
| 7,772,914 B2 | 8/2010 | Jung |
| 7,795,952 B2 | 9/2010 | Lui et al. |
| 7,830,203 B2 | 11/2010 | Chang et al. |
| 7,928,796 B2 | 4/2011 | Namekawa |
| 7,944,277 B1 | 5/2011 | Sinitsky et al. |
| 7,944,279 B1 | 5/2011 | Waffaoui |
| 7,948,301 B2 | 5/2011 | Cook et al. |
| 7,956,673 B2 | 6/2011 | Pan |
| 7,956,675 B2 | 6/2011 | Saitoh et al. |
| 7,969,235 B2 | 6/2011 | Pan |
| 7,973,592 B2 | 7/2011 | Pan |
| 7,986,160 B2 | 7/2011 | Hoang et al. |
| 8,040,184 B2 | 10/2011 | Tschuiya |
| 8,044,705 B2 | 10/2011 | Nandi et al. |
| 8,093,953 B2 | 1/2012 | Pierdomenico et al. |
| 8,093,955 B2 * | 1/2012 | Ying ............... H02M 1/44 331/111 |
| 8,159,091 B2 | 4/2012 | Yeates |
| 8,193,853 B2 | 6/2012 | Hsieh et al. |
| 8,242,834 B2 | 8/2012 | Chuang et al. |
| 8,258,857 B2 | 9/2012 | Adkins et al. |
| 8,294,509 B2 | 10/2012 | Pan et al. |
| 8,339,183 B2 | 12/2012 | Htoo et al. |
| 8,339,185 B2 | 12/2012 | Cazzaniga et al. |
| 8,358,150 B1 | 1/2013 | Snyder et al. |
| 8,395,440 B2 | 3/2013 | Sandhu et al. |
| 8,405,450 B2 | 3/2013 | Ucciardello et al. |
| 8,493,040 B2 | 7/2013 | Gunther et al. |
| 8,537,593 B2 | 9/2013 | Huynh et al. |
| 8,604,868 B2 | 12/2013 | Ucciardello et al. |
| 8,643,358 B2 | 2/2014 | Yoon |
| 8,699,247 B2 | 4/2014 | Nguyen et al. |
| 8,710,908 B2 | 4/2014 | Lin et al. |
| 8,717,699 B1 | 5/2014 | Ferris |
| 8,817,553 B2 | 8/2014 | Yu et al. |
| 2002/0008566 A1 | 1/2002 | Taito et al. |
| 2002/0014908 A1 | 2/2002 | Lauterbach |
| 2002/0075063 A1 | 6/2002 | Hwang |
| 2002/0075706 A1 | 6/2002 | Foss et al. |
| 2002/0101744 A1 | 8/2002 | DeMone |
| 2002/0130701 A1 | 9/2002 | Kleveland |
| 2002/0130704 A1 | 9/2002 | Myono et al. |
| 2002/0140463 A1 | 10/2002 | Cheung |
| 2002/0163376 A1 | 11/2002 | Pappalardo et al. |
| 2003/0128560 A1 | 7/2003 | Saiki et al. |
| 2003/0214346 A1 | 11/2003 | Pelliconi |
| 2003/0231566 A1 | 12/2003 | Smith et al. |
| 2004/0046603 A1 | 3/2004 | Bedarida et al. |
| 2004/0263238 A1 | 12/2004 | Thorp et al. |
| 2005/0024125 A1 | 2/2005 | Mcnitt et al. |
| 2005/0030088 A1 | 2/2005 | Cernea |
| 2005/0093614 A1 | 5/2005 | Lee |
| 2005/0104572 A1 | 5/2005 | Smith et al. |
| 2005/0146375 A1 | 7/2005 | Ker et al. |
| 2005/0162145 A1 | 7/2005 | Smith et al. |
| 2005/0195017 A1 | 9/2005 | Chen et al. |
| 2005/0237103 A1 | 10/2005 | Cernea |
| 2005/0248386 A1 | 11/2005 | Pan et al. |
| 2006/0098505 A1 | 5/2006 | Cho et al. |
| 2006/0114053 A1 | 6/2006 | Sohara et al. |
| 2006/0119393 A1 | 6/2006 | Hua et al. |
| 2006/0202828 A1 | 9/2006 | Shanks et al. |
| 2006/0244518 A1 | 11/2006 | Byeon et al. |
| 2006/0250177 A1 | 11/2006 | Thorp |
| 2007/0001745 A1 | 1/2007 | Yen |
| 2007/0053216 A1 | 3/2007 | Alenin |
| 2007/0069805 A1 | 3/2007 | Choi et al. |
| 2007/0126494 A1 | 6/2007 | Pan |
| 2007/0139099 A1 | 6/2007 | Pan |
| 2007/0139100 A1 | 6/2007 | Pan |
| 2007/0152738 A1 | 7/2007 | Stopel et al. |
| 2007/0210853 A1 | 9/2007 | Maejima |
| 2007/0211502 A1 | 9/2007 | Komiya |
| 2007/0222498 A1 | 9/2007 | Choy et al. |
| 2007/0229149 A1 | 10/2007 | Pan et al. |
| 2008/0012627 A1 | 1/2008 | Kato |
| 2008/0024096 A1 | 1/2008 | Pan |
| 2008/0024198 A1 | 1/2008 | Bitoni et al. |
| 2008/0042731 A1 | 2/2008 | Daga et al. |
| 2008/0068067 A1 | 3/2008 | Govindu et al. |
| 2008/0111604 A1 | 5/2008 | Boerstler et al. |
| 2008/0116963 A1 | 5/2008 | Jung |
| 2008/0136500 A1 | 6/2008 | Frulio et al. |
| 2008/0157731 A1 | 7/2008 | Pan |
| 2008/0157852 A1 | 7/2008 | Pan |
| 2008/0157859 A1 | 7/2008 | Pan |
| 2008/0174360 A1 | 7/2008 | Hsu |
| 2008/0186081 A1 | 8/2008 | Yamahira et al. |
| 2008/0218134 A1 | 9/2008 | Kawakami et al. |
| 2008/0239802 A1 | 10/2008 | Thorp et al. |
| 2008/0239856 A1 | 10/2008 | Thorp et al. |
| 2008/0278222 A1 | 11/2008 | Conte et al. |
| 2008/0307342 A1 | 12/2008 | Furches et al. |
| 2009/0033306 A1 | 2/2009 | Tanzawa |
| 2009/0051413 A1 | 2/2009 | Chu et al. |
| 2009/0058506 A1 | 3/2009 | Nandi et al. |
| 2009/0058507 A1 | 3/2009 | Nandi et al. |
| 2009/0063918 A1 | 3/2009 | Chen et al. |
| 2009/0091366 A1 | 4/2009 | Baek et al. |
| 2009/0121780 A1 | 5/2009 | Chen et al. |
| 2009/0121782 A1 | 5/2009 | Oyama et al. |
| 2009/0153230 A1 | 6/2009 | Pan et al. |
| 2009/0153231 A1 | 6/2009 | Pan et al. |
| 2009/0153232 A1 | 6/2009 | Fort et al. |
| 2009/0167418 A1 | 7/2009 | Raghavan |
| 2009/0174441 A1 | 7/2009 | Gebara et al. |
| 2009/0184697 A1 | 7/2009 | Park |
| 2009/0219077 A1 | 9/2009 | Pietri et al. |
| 2009/0219079 A1 | 9/2009 | Bergler et al. |

(56) References Cited

U.S. PATENT DOCUMENTS

| | | |
|---|---|---|
| 2009/0296488 A1 | 12/2009 | Nguyen et al. |
| 2009/0315598 A1 | 12/2009 | Namekawa |
| 2009/0315616 A1 | 12/2009 | Nguyen et al. |
| 2009/0322413 A1 | 12/2009 | Huynh et al. |
| 2010/0019832 A1 | 1/2010 | Pan |
| 2010/0033232 A1 | 2/2010 | Pan |
| 2010/0085794 A1 | 4/2010 | Chen et al. |
| 2010/0118625 A1 | 5/2010 | Matano |
| 2010/0127761 A1 | 5/2010 | Matano |
| 2010/0074034 A1 | 9/2010 | Cazzaniga |
| 2010/0244935 A1 | 9/2010 | Kim et al. |
| 2010/0283549 A1 | 11/2010 | Wang |
| 2010/0302877 A1 | 12/2010 | Bang |
| 2011/0026329 A1 | 2/2011 | Wada |
| 2011/0068857 A1 | 3/2011 | Ucciardello et al. |
| 2011/0133820 A1 | 6/2011 | Pan |
| 2011/0133821 A1 | 6/2011 | Honda |
| 2011/0148509 A1 | 6/2011 | Pan et al. |
| 2011/0156803 A1 | 6/2011 | Yap et al. |
| 2011/0169557 A1 | 7/2011 | Yamahira et al. |
| 2011/0176370 A1 | 7/2011 | Izumi et al. |
| 2011/0254615 A1 | 10/2011 | Raghunathan et al. |
| 2012/0230071 A1 | 9/2012 | Kaneda |
| 2012/0274394 A1 | 11/2012 | Chan |
| 2013/0162229 A1 | 6/2013 | Chan |
| 2013/0181521 A1 | 7/2013 | Khlat |
| 2013/0221938 A1 | 8/2013 | Conte et al. |
| 2014/0084936 A1 | 3/2014 | Pan et al. |
| 2014/0085985 A1 | 3/2014 | Pan et al. |
| 2014/0375293 A1 | 12/2014 | Pan et al. |
| 2015/0249428 A1* | 9/2015 | Huynh .................. H03B 5/04 365/185.18 |

FOREIGN PATENT DOCUMENTS

| | | |
|---|---|---|
| CN | 101902059 A | 12/2010 |
| DE | 10 2007 026290 A1 | 7/2008 |
| EP | 0 382 929 A2 | 8/1990 |
| EP | 0 780 515 A1 | 6/1997 |
| EP | 1 362 320 A2 | 11/2003 |
| EP | 1 925 062 A2 | 5/2008 |
| JP | 2007-020268 A | 1/2007 |
| WO | WO-2001006336 A1 | 1/2001 |
| WO | WO-2002065380 A2 | 8/2002 |
| WO | WO-2006132757 A2 | 12/2006 |
| WO | WO-2007026289 A1 | 3/2007 |

OTHER PUBLICATIONS

Pan, "Charge Pump Circuit Design," McGraw-Hill, 2006, 26 pages.
Pylarinos et al., "Charge Pumps: An Overview," Department of Electrical and Computer Engineering, University of Toronto, Proceedings of Symposium May 2003, 7 pages.

* cited by examiner

Charging Half Cycle

Transfer Half Cycle

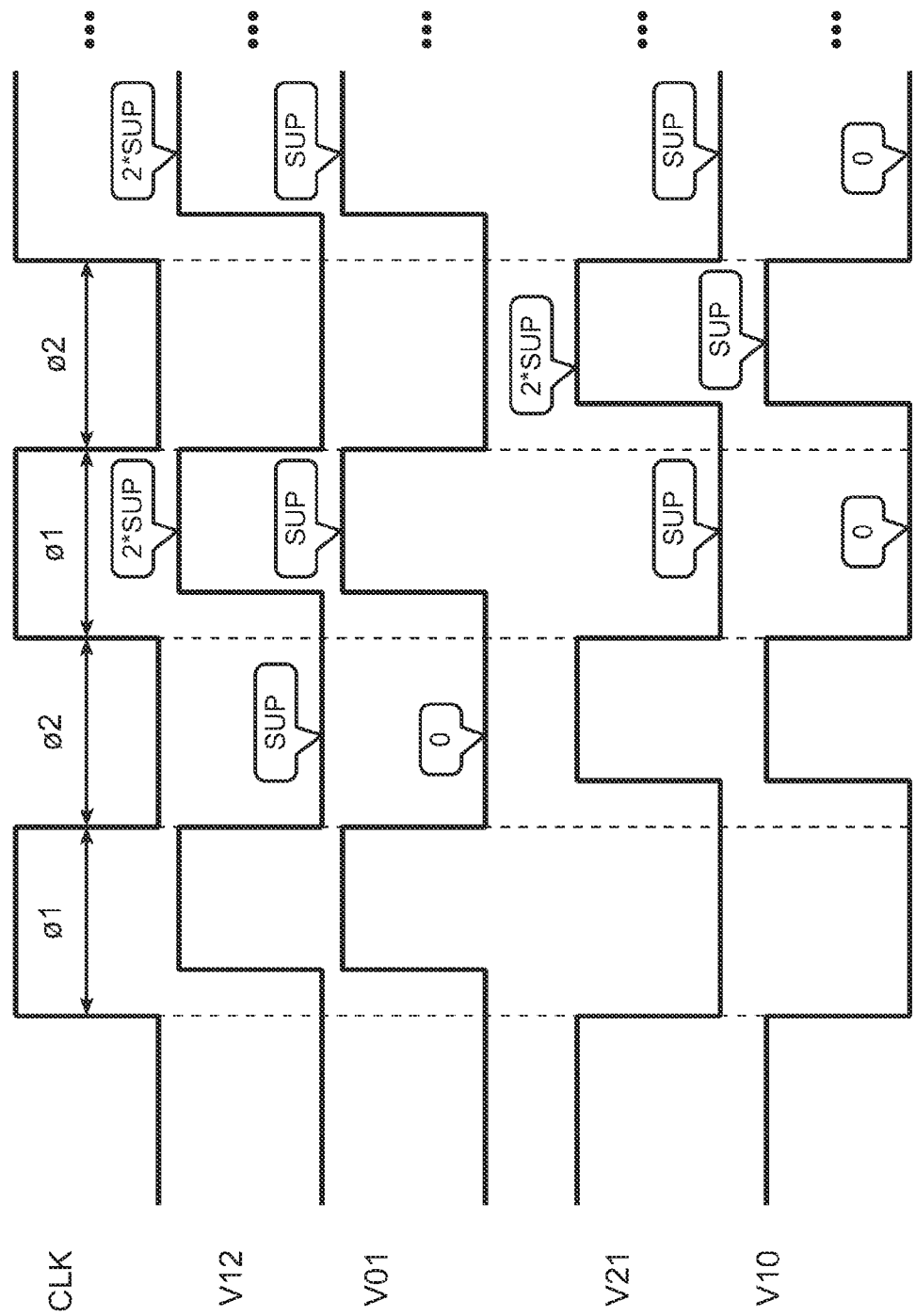

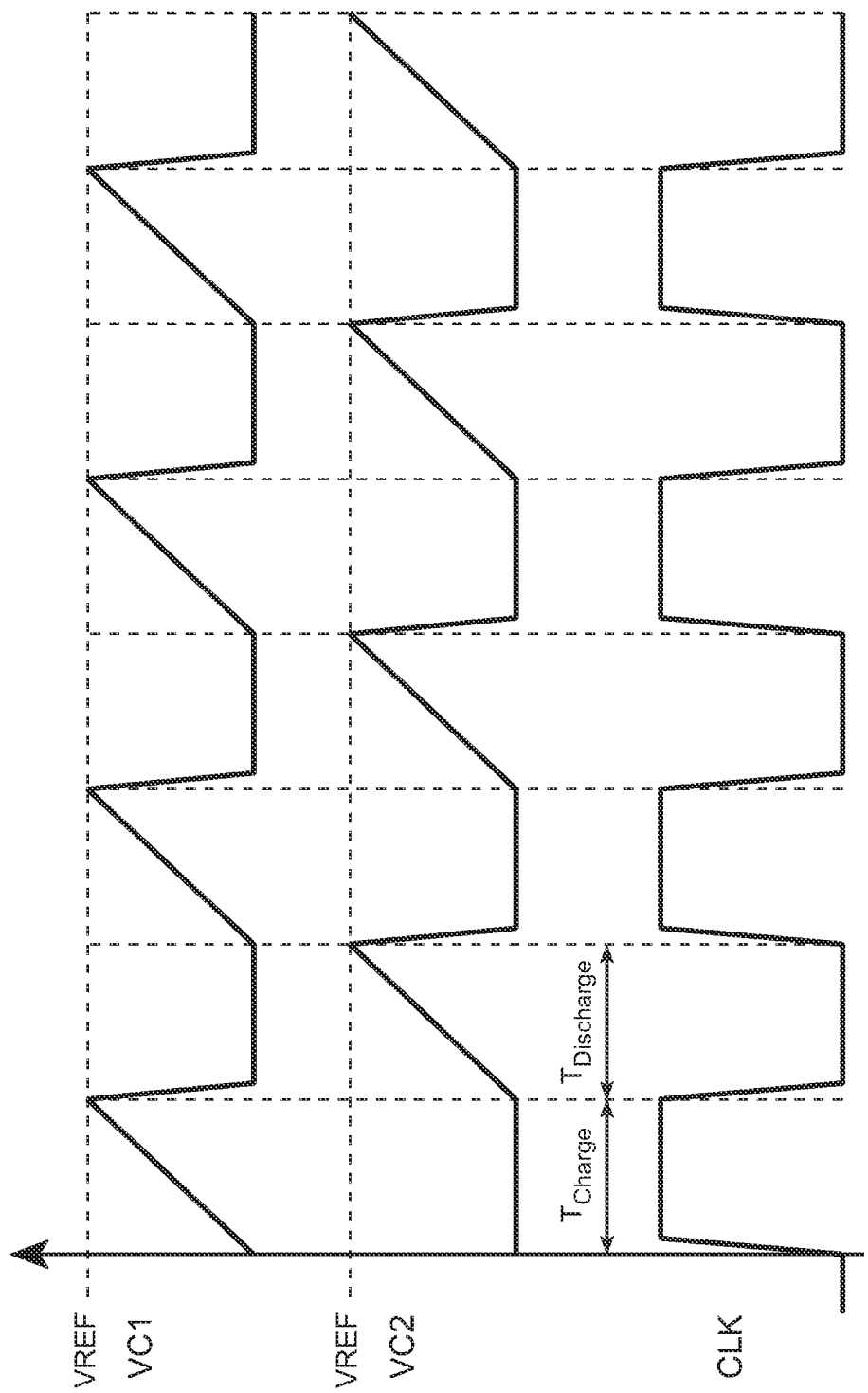

DYNAMIC CLOCK PERIOD MODULATION SCHEME FOR VARIABLE CHARGE PUMP LOAD CURRENTS

BACKGROUND

This following pertains generally to the field of charge pumps and more particularly to techniques for regulating charge pumps.

Charge pumps use a combination of switches and capacitors to provide a DC output voltage higher or lower than its DC input voltage. To generate the required output, transfer of charge from input to output happens through Capacitors and switches. During one clock half cycle, the charging half cycle, the capacitor couples in parallel to the input so as to charge up to the input voltage. During a second half cycle, the boost half cycle, the charged capacitor's bottom plate is boosted with the input voltage so as to provide an output voltage twice the level of the input voltage. This process is illustrated in FIGS. 1A and 1B. In FIG. 1A, the capacitor 5 is arranged in parallel with the input voltage $V_{IN}$ to illustrate the charging half cycle. In FIG. 1B, the charged capacitor 5 is arranged in series with the input voltage to illustrate the transfer half cycle. As seen in FIG. 1B, the positive terminal of the charged capacitor 5 will thus be $2*V_{IN}$ with respect to ground.

Charge pumps are used in many contexts. For example, they are used as peripheral circuits on flash and other non-volatile memories to generate many of the needed operating voltages, such as sensing, programming or erase voltages, from a lower power supply voltage. A number of charge pump designs, such as conventional Dickson-type pumps, are know in the art. But given the common reliance upon charge pumps, there is an on going need for improvements in pump design, particularly with respect to trying to save on current consumption and reduce the amount ripple in the output of the pump.

SUMMARY

A charge pump circuit system includes a charge pump circuit, connected to receive a clock signal and a supply voltage and generate from them an output voltage at an output node of the charge pump system, and regulation circuitry. The regulation circuitry includes a feedback circuit, connected to receive the output voltage and generate from it a regulation voltage, a first transistor, that has a gate connected to receive the regulation voltage and through which the charge pump circuit is connected to the supply voltage, and a clock circuit. The clock circuit includes: a current mirroring element connected to receive the regulation voltage and generate from it a first current having a level proportional to a current supplied to the charge pump circuit by the first transistor; and a current controlled oscillator connected to receive the first current and generate from it the clock signal, wherein the frequency of the clock signal is dependent upon the level of the first current.

A method of generating a regulated output voltage includes receiving a clock signal and a supply voltage at a charge pump circuit, and generating by the charge pump circuit of the output voltage from the clock signal and the supply voltage. A feedback circuit receives the output voltage and generates a regulation voltage from the output voltage. The regulation voltage is applied at a control gate of a first transistor through which the charge pump is connected to receive the supply voltage. A current supplied to the charge pump circuit by the first transistor is mirrored to generate a first current having a level proportional to the current supplied to the charge pump circuit by the first transistor. A current controlled oscillator receives the first current and generating from it the clock signal, where the frequency of the clock signal is dependent upon the level of the first current.

Various aspects, advantages, features and embodiments are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 4A and 4B illustrate in more detail the operation of a charge pump system used a fixed clock frequency.

FIGS. 6A and 6B are a schematic representation of an alternate embodiment of a charge pump system and a corresponding set of waveforms.

DETAILED DESCRIPTION

The techniques presented here are widely applicable to various charge pump designs to reduce overall power consumption for charge pump system and for reducing switching current. As noted in the Background, non-volatile memory systems often are designed for use with relative low voltage power supplies, but need higher voltage levels to perform various read, write and erase operations. For example, with NAND Memory applications, such as for 2D NAND or 3D devices such as of the BiCS type, elements such bit line drivers and various op-amps use higher (2×-3×) than the given supply voltage. These voltages are generated by the charge pump circuitry on the memory chips that can be the major power consuming circuitry on the circuit. Furthermore these pumps are typically designed to operate at the single clock frequency at which the pump performance meets the worst case load conditions. This will result in high switching and high switching current at the lower loads. The techniques presented here can help to minimize the pump switching frequency according to the load current requirement, consequently minimizing the corresponding switching current. Although the following discussion is often given in the context of using a charge pump for a memory system, the techniques described are more generally applicable to other circuits where boosted voltage levels are needed (i.e. charge pumps having large capacitive loads and small load current requirement).

Figure 1A:
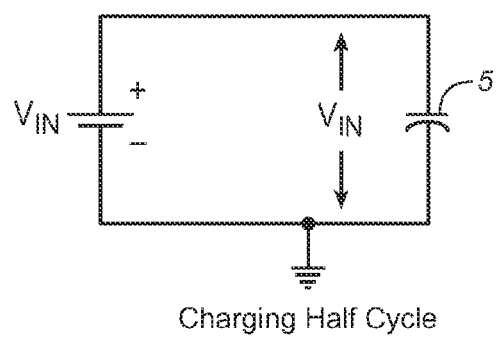
FIG. 1A is a simplified circuit diagram of the charging half cycle in a generic charge pump.
Figure 1B:
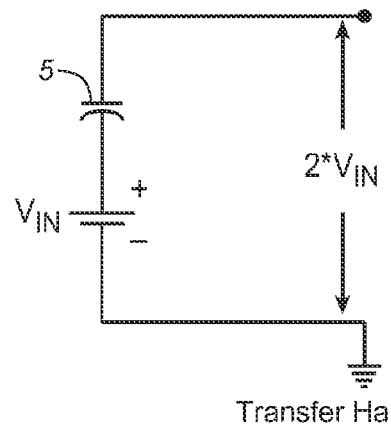
FIG. 1B is a simplified circuit diagram of the transfer half cycle in a generic charge pump.
Figure 2:
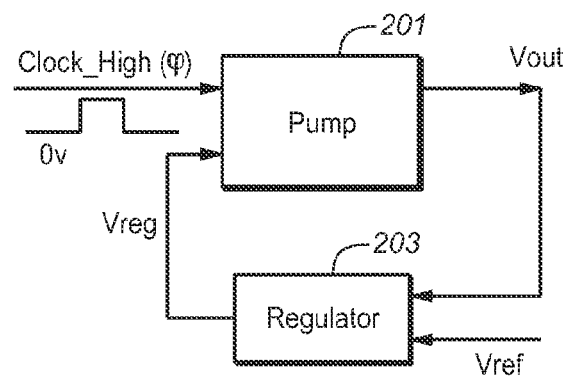
FIG. 2 is a top-level block diagram for a regulated charge pump.

FIG. 2 is a top-level block diagram of a typical charge pump using an output voltage based regulation scheme. As shown in FIG. 2, the pump 201 has as inputs a clock signal and a voltage Vreg and provides an output Vout. The clock generation circuit is not explicitly shown in FIG. 2, although it may be considered part of the charge pump system in some embodiments or taken as an external input. The high (Vdd) and low (ground) connections are also not explicitly shown. The voltage Vreg is provided by the regulator 203, which has as inputs a reference voltage Vref from an external voltage source and the output voltage Vout. The regulator block 203 generates feedback control signal Vreg such that the desired value of Vout can be obtained. The pump section 201 may have any of various designs for charge pumps, including charge doubler-type circuits with cross-coupled elements as well as the Dickson-type pumps. (A charge pump is typically taken to refer to both the pump portion 201 and the regulator 203, when a regulator is included, although in some usages "charge pump" refers to just the pump section 201. In the following, the terminology "charge pump system" will often be used to describe pump itself as well as any regulation circuitry or other associated elements).

Figure 3:
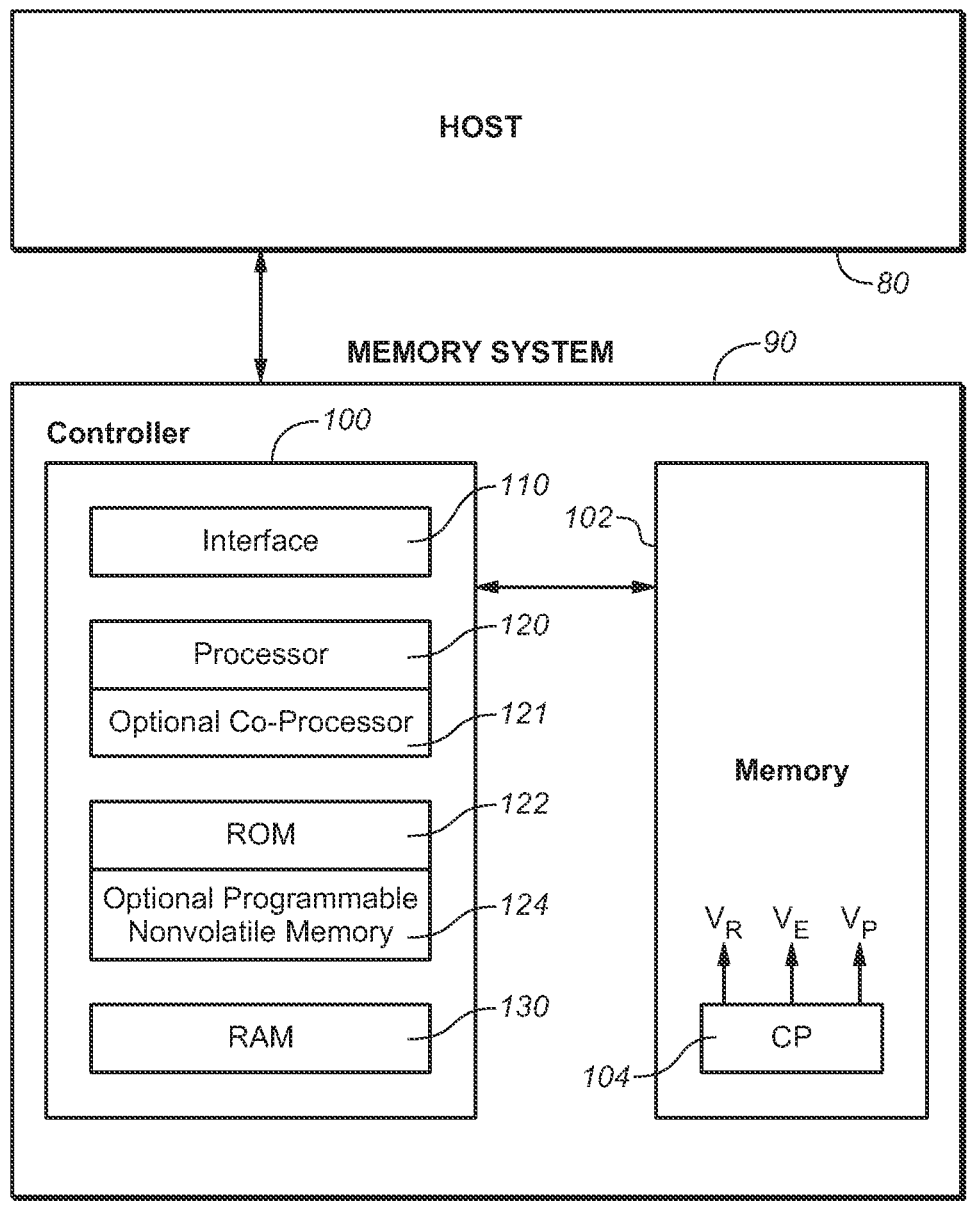
FIG. 3 is a schematic representation of a non-volatile memory system, in which charge pumps are commonly used.

FIG. 3 illustrates schematically the main hardware components of a memory system that includes an integrated non-volatile memory circuit such as that on which a charge pump might be used as a peripheral element for generating needed operating voltages. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip, which can include one or more charge pumps 104 as peripheral element to provide various voltages for read, write or erase operations (schematically represented as VR, VP, VE) that need values boosted above the on-ship supply level. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

With respect to the memory section 102, semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It will be recognized that the following is not limited to the two dimensional and three dimensional exemplary structures described but cover all relevant memory structures within the spirit and scope as described herein. More detail on such memory devices and systems is given in U.S. patent application Ser. No. 14/528,711 filed on Oct. 30, 2014.

Figure 4A:
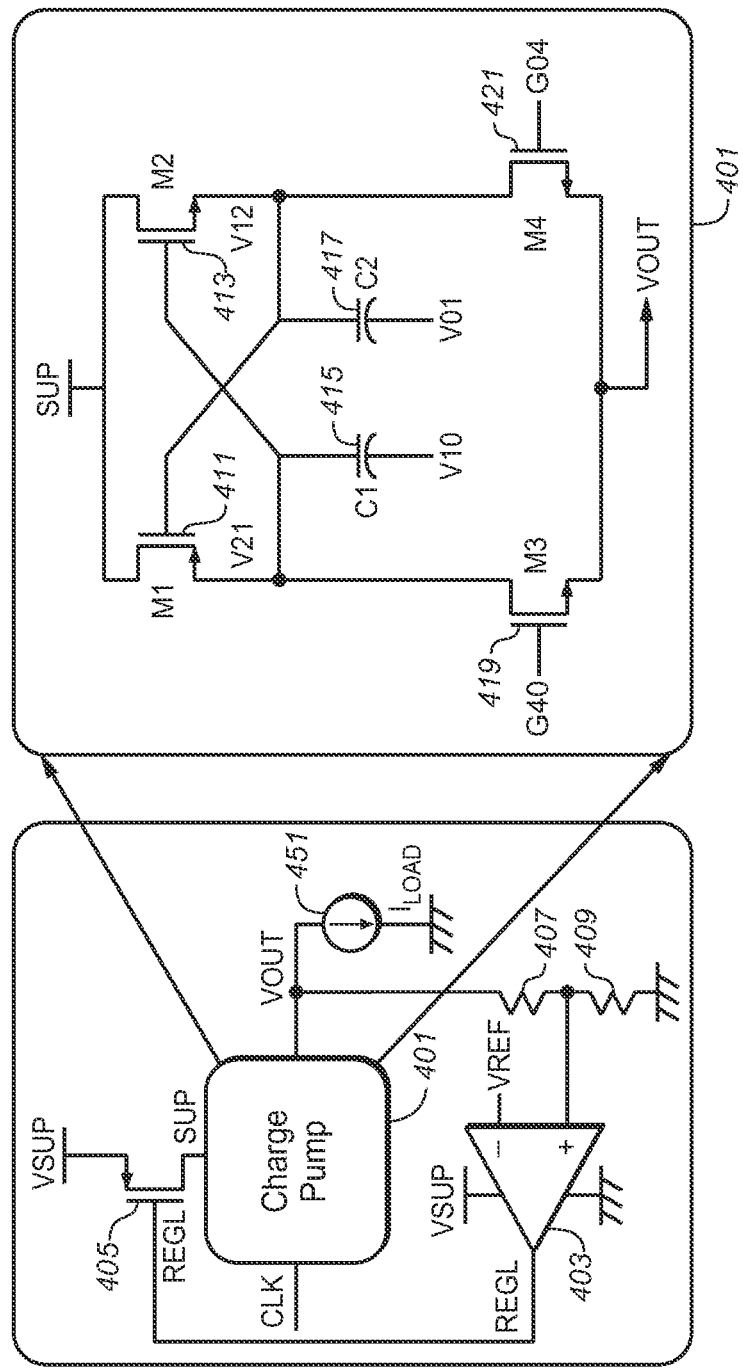

Returning to the specifics of charge pumps, FIGS. 4A and 4B show an example of a charge pump circuit with corresponding clocking scheme in more detail. In FIG. 4A a charge pump 401 receives a fixed clock signal CLK and generates a voltage VOUT at its output node that can be connected to drive a load represented here as $I_{LOAD}$ 451. The pump 401 is connected to the VSUP level through a transistor 405 whose gate is connected to receive the regulation level REGL that sets the level SUP seen at the pump and supplies the current, both the current to the load as well as any non-load quiescent current, flowing into the pump. The regulation voltage REGL is the output of operational amplifier 403 that has a first input receiving feedback from the output of the pump and a second input connected to a reference level, such as from a bandgap. In this example, the feedback comes from the node of a voltage divider formed of the resistances 407 and 409 connected in series between the pump's output node and ground, although other dividers (such as those incorporating capacitances) can be used.

To the right of FIG. 4A is some detail of a pump example and FIG. 4B shows some waveforms of a clocking scheme. The pump detail in this example show a single stage voltage doubler, but the pump may have multiple stages that can also be of the Dickson type, four-phase, or other charge pump structures, such as those described in U.S. patent publication number 2015-0091637. The pump capacitors C1 415 (C2 417) charge with M1 411 (M2 413) during the ø1 (ø2) phase and deliver the output charge during ø2 (ø1) phase through the M3 419 (M4 421) transistors. The signals G04 and G40 can be generated from an auxiliary pump supply that is not shown in the detail of FIG. 4A. Since on chip capacitors suffer from high parasitics, each node is associated with significant parasitic capacitance. During the operation of each cycle, these parasitics will be charged and discharged, resulting in higher current ICC being drawn, where this is proportional to the switching frequency.

Due to the high switching current ($I_{sw}$) under no load condition and lower load currents, the efficiency of the pump greatly reduces at the lower loads. This is illustrate by equation (1):

$$\text{efficiency } (\eta) = \frac{\text{Output Power}}{\text{Input Power}} = \frac{VOUT * I_{LOAD}}{VSUP * I_{SUP}} \Rightarrow \frac{VOUT * I_{LOAD}}{VSUP(2 * I_{LOAD} + I_{SW})}, \quad (1)$$

where VOUT is output voltage, $I_{LOAD}$ is the load current, $I_{SUP}$ is the supply current.

Since the high switching current results in poor efficiency, the following describes the use of a dynamic clock period modulation scheme for variable load currents to reduce the switching current and improve the pump system's efficiency. A charge pump's driving capability is proportional to the frequency of operation, so that as the load decreases the switching frequency can be scaled accordingly to maintain the target output voltage. In approaches based on using the VOUT level of the pump in a voltage controller oscillator (VCO) to set the clock frequency, non-linear characteristics of voltage controlled oscillators result in the clock period not increasing (or frequency not decreasing) linearly with the decrease in load current. Consequently, even though a VCO approach addresses the requirement of a dynamically changing load matching clocking scheme, it fails to maintain the linear relationship between switching frequency and the load requirement.

In the following exemplary embodiments, load current information can be obtained from the REGL signal. This load current information can be used to generate a clock signal whose frequency varies linearly with the load current through use of a linear current controlled oscillator (CCO). A first exemplary implementation to realize this linear current controlled oscillator as shown in FIG. 5A.

Figure 5A:
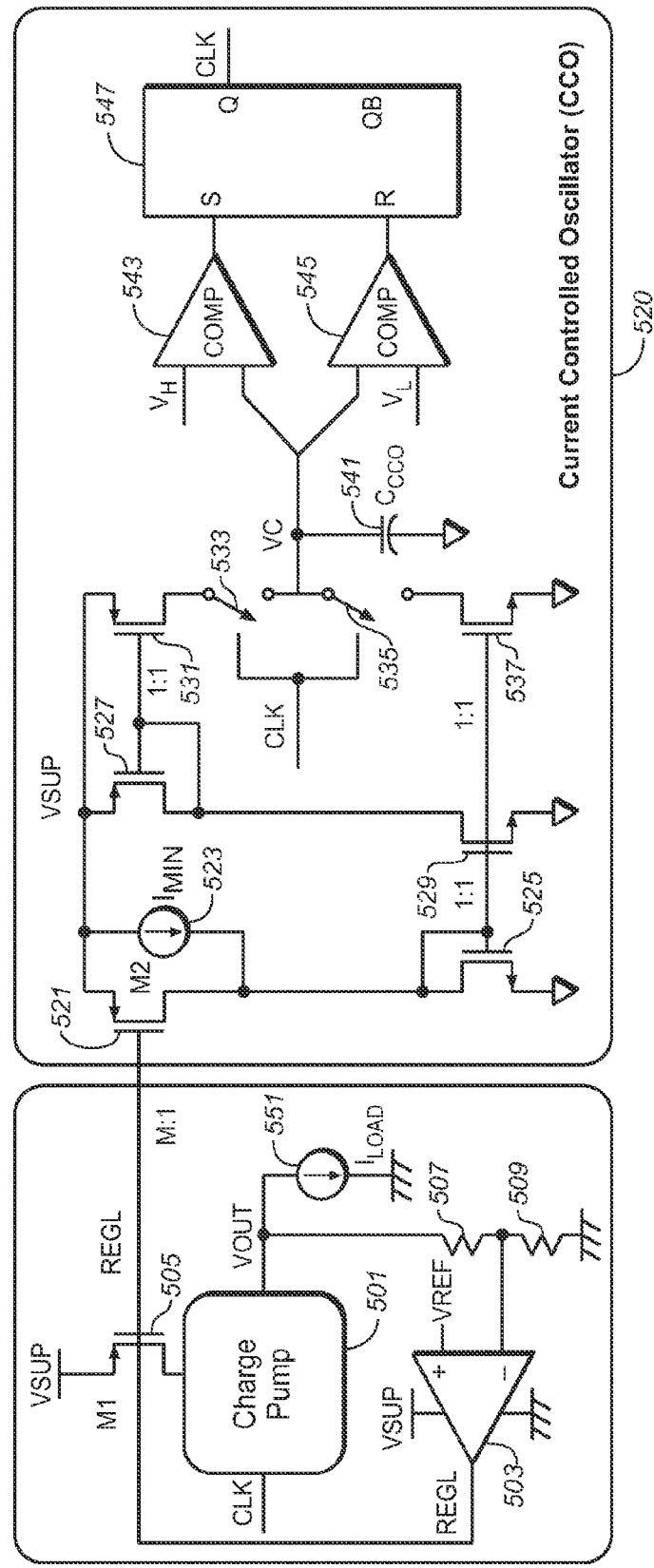
FIGS. 5A and 5B are a schematic representation of an exemplary embodiment of a charge pump system and a corresponding set of waveforms.

To the left of FIG. 5A, the elements are as in FIG. 4A and similarly numbered, but rather than a fixed CLK signal, the section 520, to the right, generates the CLK signal. With REGL signal, the current supplied though M1 505 is mirrored to the M2 pmos transistor 521, which is used to charge/discharge the capacitor $C_{CCO}$ 541. As the CCO section is used to generate the clock CLK with a desired frequency operating range (unlike the case of pump where it has to deliver the load), the mirror ratio need not to be 1:1 and a fraction of it should be sufficient enough to generate the required range and as indicated by the notation "M:1". This fractional mirroring allows the current through M2 521 to be a fraction 1/M of that through M1 505, allowing the clock CLK to track the current into the charge pump 501 while consuming relatively a small current for itself.

Figure 5B:
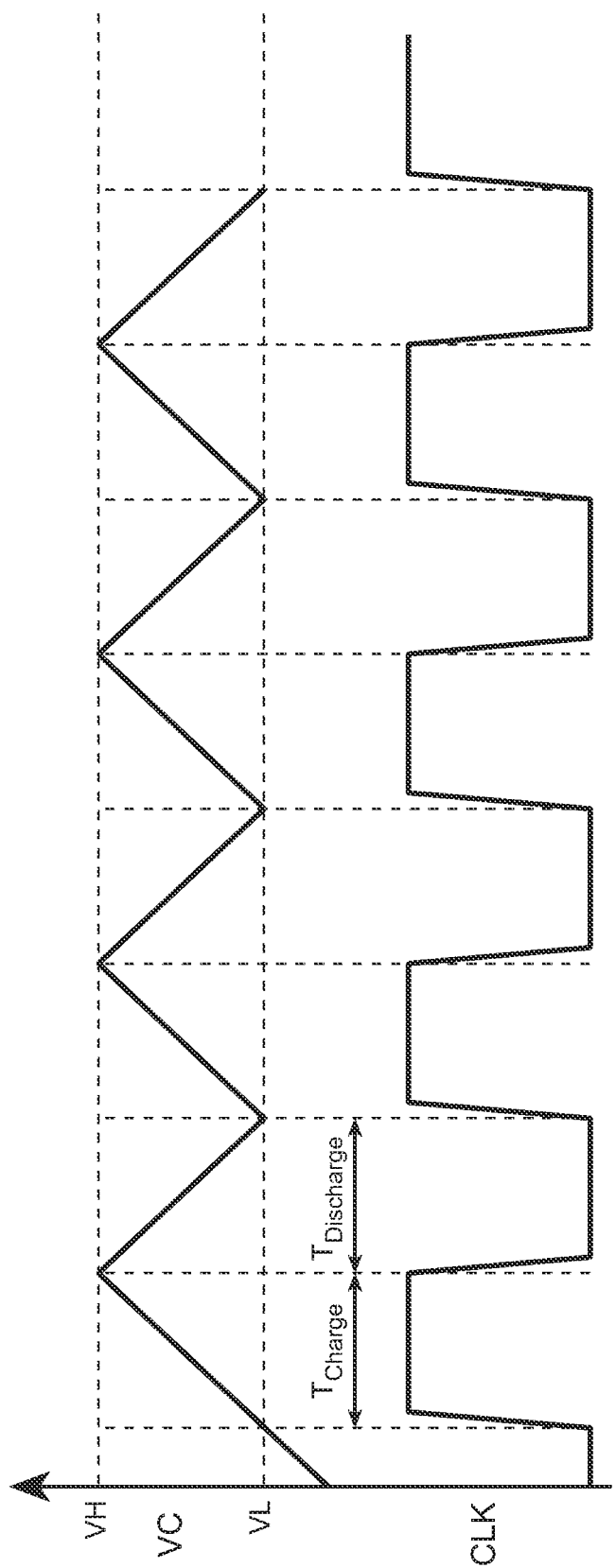

The transistors 531 and 537 are used respectively to charge and discharge the capacitor $C_{CCO}$ 541 and have their gate voltages set by way of the intermediate mirroring circuitry including the diode connected transistor 525, through which M2 521 is connected to ground, the transistor 529, whose gate is commonly connected with those of 525 and 537, and the diode connected pmos 527, through which 529 is connected to VSUP and whose gate is commonly connected with transistor 531. The top plate of $C_{CCO}$ 541 is connected alternately through 531 to VSUP by switch 533 and ground through 537 by switch 535 based upon the phase of CLK, so that the voltage across the capacitor (VC) linearly charges/discharges with time depending on the clock phase. As VC goes beyond $V_H$, comparator 543 will reset SR latch 547 to discharge mode. As soon as VC goes less than $V_L$, comparator 545 will set the SR latch 547 to the charging mode. FIG. 5B shows the voltage across the capacitor and the generated CLK.

The $I_{MIN}$ from the current source 523 in parallel with M2 521 is a current to maintain a minimum frequency for CLK to meet VOUT ripple specification. As noted, the "M:1" is to represent that M is the current mirror ratio between M2 521 and M1 505 as the current through M2 only is being used to determine CLK, whereas the current through M1 needs to large enough to meet the needs of the charge pump driving the load along with any quiescent current. With the CCO section 520, the transistors are all similarly sized ("1:1") to the current through M2 521 combined with $I_{MIN}$, although other ratios can be used. The $V_H$ and $V_L$ levels are generated separately from regulation circuitry that is not shown in FIG. 5A.

Figure 6A:
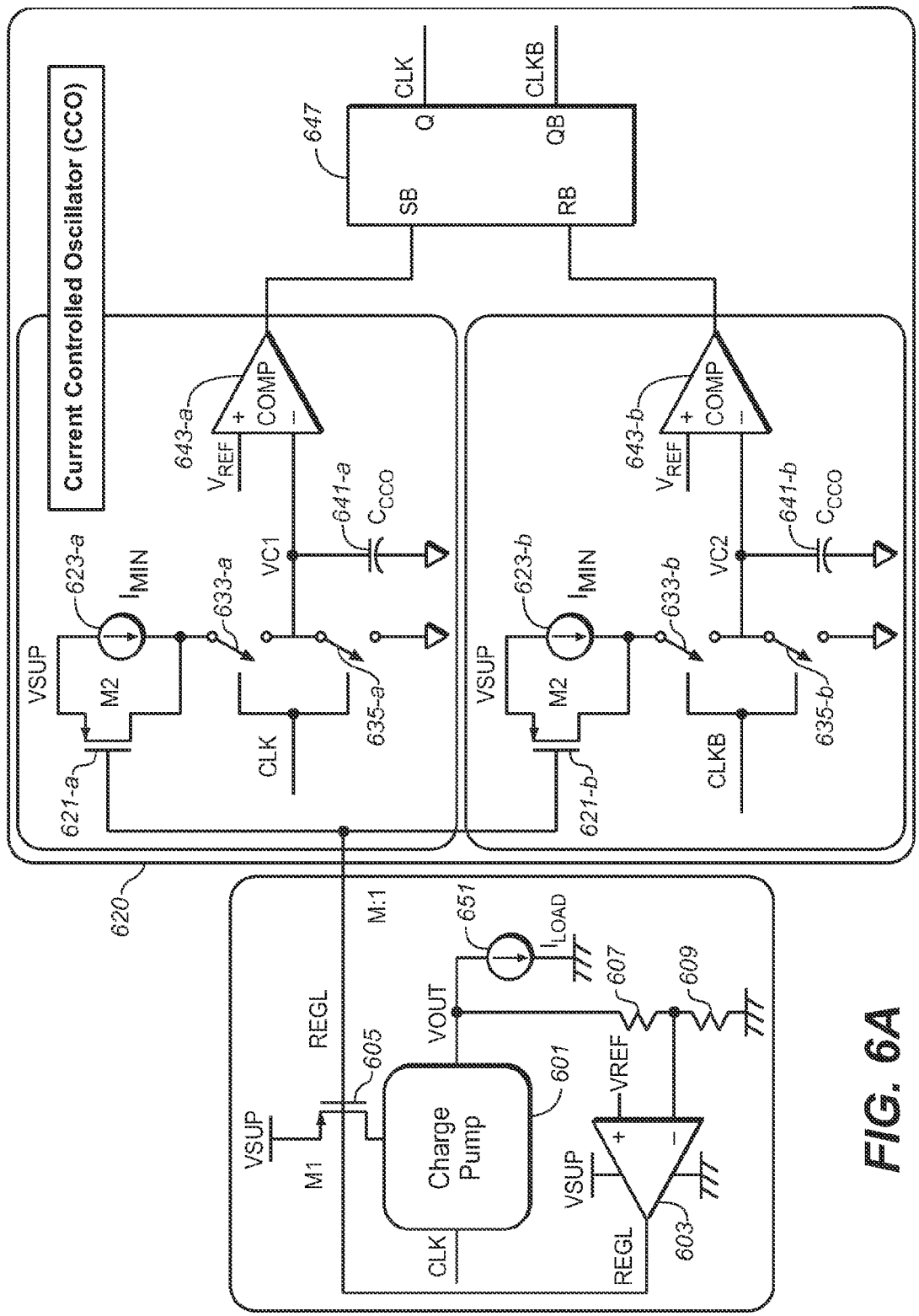

An alternate embodiment to realize the linear CCO as shown in FIG. 6A and corresponding waveforms are shown in FIG. 6B. In FIG. 6A at left, the elements are as before and similarly numbered. To the right, the CCO section again has a set/reset latch 647, but the set and reset signals are generated in two different subsections. The set signal (SB) is from a comparator "643-a" which compares the level VC1 on capacitor $C_{CCO}$ 641-a with a reference level $V_{REF}$ (which, depending on the embodiment, would or would not be same as the reference voltage used for the op-amp 503). The current through M1 605 is mirrored (at a M:1 ratio) in M2 621-a in parallel with the current source 623-a to charge the node VC1, which is charged/discharged by the switches 633-a/635-a based on the phase of the signal CLK. The reset signal (RB) is generated similarly, based on the level VC2 switched according the inverted version of the clock signal CLKB. In FIG. 6B, the time taken to charge the capacitor from 0 to $V_{REF}$ is $T_{charge}$, while the discharge time from $V_{REF}$ to 0 is $T_{discharge}$.

Referring back to FIGS. 5A and 5B, $$T_{Charge} = T_{Discharge} = \frac{C*dV}{I} = \frac{C*(V_H - V_L)}{I_{LOAD}/M} = \frac{M*C*(V_H - V_L)}{I_{LOAD}}, \quad (2)$$

with a similar expression for FIGS. 6A and 6B for the high (i.e., $V_H$=VREF) and low values (i.e., $V_L$=0) of VC1 and VC2.

From eq. 2, $$f = \frac{1}{T_{Charge} + T_{Discharge}} = \frac{I_{LOAD}}{2M*C*(V_H - V_L)} \Rightarrow f \alpha I_{LOAD}, \quad (3)$$

Due to the linear relationship between the switching frequency and load current, the switching current will vary with load current linearly:

$$I_{SW} \alpha f \alpha I_{LOAD} = I_{SW} = kI_{LOAD} \text{ where k is const} \quad (4).$$

The efficiency η is the ratio of output power to input power:

From eq. 4, $\eta = \frac{VOUT*I_{LOAD}}{VSUP(2*I_{LOAD} + I_{SW})} =$ (5)

$$\frac{VOUT*I_{LOAD}}{VSUP(2*I_{LOAD} + kI_{LOAD})} \Rightarrow \eta = \frac{VOUT}{VSUP(2+k)}.$$

Figure 7B:
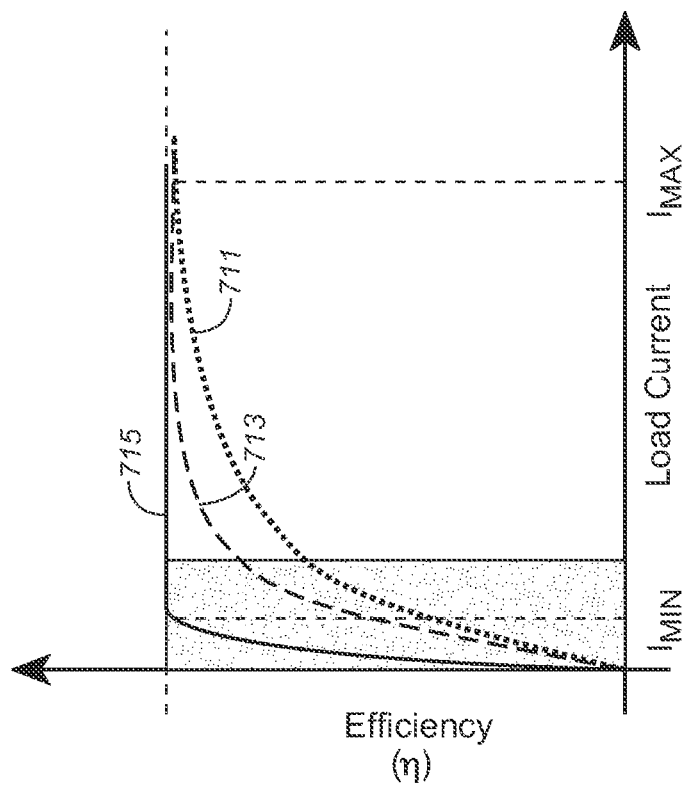
FIGS. 7A and 7B respectively illustrate the frequency vs. load current and efficiency vs. load current of different charge pump clocking schemes.
Figure 7A:
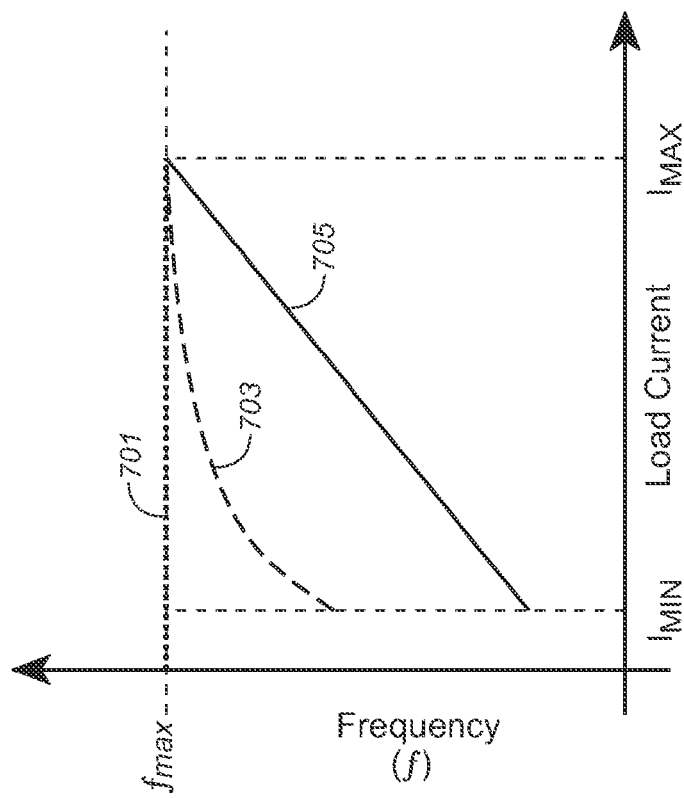

FIGS. 7A and 7B are respectively plots of frequency vs. load current and efficiency vs. load current. In FIG. 7A, 701 corresponds to a fixed clock arrangement (as in FIGS. 4A and 4B), 703 corresponds to the typically non-linear clocking scheme when a voltage controlled oscillator (VCO) is used to generate the clock signal, and 705 corresponds to the linear behavior presented by the sort of arrangement in FIGS. 5A, 5B, 6A, 6B. In the efficiency vs. load current of FIG. 7B, 711 corresponds to a fixed clock arrangement (as in FIGS. 4A and 4B), 713 corresponds to the typically non-linear clocking scheme when a voltage controlled oscillator (VCO) is used to generate the clock signal, and 715 corresponds to the linear behavior presented by the sort of arrangement in FIGS. 5A, 5B, 6A, 6B.

In fixed clock frequency arrangement, the pump is designed to support worst case current loading, which sets the switching frequency to maximum and results in higher ICC, and hence lower efficiency at lower load currents. As the load increases, output power will increase, resulting in increased in efficiency with increased load current.

With a non-linear frequency relationship such as represented by 703, the frequency will start at somewhat lower frequencies compared to the single frequency case and reach the maximum frequency at the high current loadings. This results high switching frequencies at the lower loads resulting poor efficiency.

With linear frequency relationship, the efficiency will largely be fixed for loads above $I_{MIN}$. The efficiency is independent of the load variation and set to a maximum (as shown in eq.5) even at lower load conditions.

Consequently, the use of a linear charge coupled oscillator (CCO) to dynamically modulate the charge pump's clock period based on the variable charge pump load current can significantly improve operation as this helps to minimize the switching frequency in a way that is not possible with non-linear oscillators. This will result in minimizing switching current and improved efficiency. With a linear CCO, the efficiency will be optimized across the range of load currents, whereas the trimming of non-linear oscillators results poor accuracy due to supply change. In a linear oscillator, the trimming can be done at maximum load by changing the current mirror ratio (the width of M1 505 to M2 521 in FIG. 5A or the width of M1 605 to M2 621-a/621-b of FIG. 6A) without losing accuracy.

The foregoing detailed description has been presented for purposes of illustration and description. It is not intended to be exhaustive or to limit the above to the precise form It is claimed:

1. A charge pump system, comprising:
a charge pump configured to generate an output voltage potential at an output node by use of a clock signal and a supply current; and
a clock circuit configured to produce the clock signal for the charge pump, the clock circuit comprising:
a current mirroring element configured to generate a first current having a magnitude that is substantially a fraction of a magnitude of the supply current to the charge pump, and
a current controlled oscillator configured to produce the clock signal for the charge pump based on the magnitude of the first current such that a frequency of the clock signal varies with the magnitude of the supply current to the charge pump.

2. The charge pump system of claim 1, wherein the current controlled oscillator is configured to vary the frequency of the clock signal substantially linearly with the magnitude of the first current.

3. The charge pump system of claim 1, wherein the current mirroring element includes a first transistor connected between a supply voltage and ground, having a gate connected to receive a regulation voltage, wherein the regulation voltage corresponds to the output voltage potential, and wherein the current controlled oscillator includes:
a current source connected in parallel with the first transistor to provide a second current;
a capacitor;
switching circuitry connected to receive the clock signal and, based on the clock signal, alternately connect the capacitor to charge and discharge at a rate based on the combined first and second currents;
a comparison circuit connected to the capacitor, a first reference voltage, and a second reference voltage, wherein the comparison circuit generates set and reset signals based on a voltage level on the capacitor relative to the first and second reference voltages; and
a latch connected to receive the set and reset signals and generate the clock signal therefrom.

4. The charge pump system of claim 3, wherein the current controlled oscillator further comprises intermediate mirroring circuitry connected to the switching circuitry and through which the first transistor and the current source are connected to ground.

5. The charge pump system of claim 3, further comprising:
a feedback circuit configured to generate the regulation voltage from the output voltage potential; and
a regulation transistor connected between the supply voltage and the charge pump, wherein a gate of the regulation transistor receives the regulation voltage, and wherein the first transistor is sized smaller than the regulation transistor.

6. The charge pump system of claim 1, further comprising regulation circuitry, the regulation circuitry comprising:
a feedback circuit configured to generate a regulation voltage potential corresponding to the output voltage potential, wherein the current mirroring element includes first and second transistors each connected between a supply voltage and ground and each having a gate connected to the regulation voltage potential, and wherein the current controlled oscillator includes:
a set signal generation section having:
a first current source connected in parallel with the first transistor to provide a second current;
a first capacitor;
first switching circuitry connected to receive the clock signal and, based on the clock signal, alternately connect the first capacitor to charge and discharge at a rate based on the combined first and second currents; and
a first comparison circuit connected to the first capacitor and to a reference voltage potential, where the first comparison circuit generates a set signal based on a voltage level on the first capacitor relative to the reference voltage potential; and
a reset signal generation section having:
a second current source connected in parallel with the second transistor to provide a third current;
a second capacitor;
second switching circuitry connected to receive an inverted form of the clock signal and, based on the inverted form of the clock signal, alternately connect the second capacitor to charge and discharge at a rate based on the combined first and third currents; and
a second comparison circuit connected to the second capacitor and to the reference voltage potential, where the second comparison circuit generates a reset signal based on a voltage level on the second capacitor relative to the reference voltage potential; and
a latch connected to receive the set and reset signals and generate the clock signal therefrom.

7. The charge pump system of claim 6, wherein:
the supply current flows to the charge pump through a regulation transistor,
a gate of the regulation transistor is coupled to the reference voltage potential,
the first transistor is sized smaller than the regulation transistor, and
the first and second transistors are similarly sized.

8. The charge pump system of claim 1, further comprising:
a feedback circuit configured to generate a reference voltage signal, wherein the feedback circuit comprises:
a voltage divider circuit connected between the output node and ground, and
an operational amplifier configured to generate the reference voltage signal from a first input connected to a node of the voltage divider circuit, and a second input connected to receive the reference voltage signal; and
a regulation transistor connected between a source voltage and the charge pump, wherein a gate of the regulation transistor receives the reference voltage signal.

9. The charge pump system of claim 1, wherein the charge pump comprises a voltage doubler.

10. The charge pump system of claim 1, wherein the charge pump system is formed on a non-volatile memory circuit.

11. The charge pump system of claim 10, wherein the output voltage potential is for use in one or more of a programming operation, an erase operation, and a sensing operation.

12. The charge pump system of claim 10, wherein the non-volatile memory circuit is a monolithic three-dimensional semiconductor memory device having memory cells arranged in multiple physical levels above a silicon substrate and that each include a charge storage medium.

13. A method, comprising:
generating an output voltage potential by a charge pump circuit, wherein the charge pump circuit generates the output voltage potential responsive to a pump clock signal and by use of supply current;
mirroring the supply current being supplied to the charge pump circuit to generate the output voltage potential, wherein mirroring the supply current comprises generating a first current, the first current having a level configured to be substantially fractional to a level of the supply current being supplied to the charge pump circuit; and
generating the pump clock signal by use of the first current, wherein generating the pump clock signal comprises adapting a frequency of the pump clock signal based upon the level of the first current such that the frequency of the pump clock signal is dependent upon the level of the supply current being supplied to the charge pump circuit.

14. The method of claim 13, wherein adapting the frequency of the pump clock signal comprises varying the frequency of the pump clock signal linearly with the level of one of the first current and the supply current.

15. The method of claim 13, wherein the supply current is supplied to the charge pump circuit through a first transistor, the method further comprising:
producing a regulation signal configured to correspond to the output voltage potential generated by the charge pump circuit;
applying the regulation signal to a control gate of the first transistor; and
applying the regulation signal to a control gate of a second transistor, the second transistor configured to mirror the supply current being supplied to the charge pump circuit.

16. The method of claim 13, further comprising:
generating a regulation voltage that corresponds to the output voltage potential being generated by the charge pump circuit;
wherein the first current is generated by a current mirror element, comprising first and second transistors connected between a supply voltage and ground and each having a gate connected to receive the regulation voltage; and
wherein the pump clock signal is generated by a current controlled oscillator comprising:
a set signal generation section having:
a first current source connected in parallel with the second transistor to provide a second current;
a first capacitor;
first switching circuitry connected to receive the pump clock signal and, based on the pump clock signal, alternately connect the first capacitor to charge and discharge at a rate based on the combined first and second currents; and
a first comparison circuit connected to the first capacitor and to a reference voltage, where the first comparison circuit generates a set signal based on a voltage level on the first capacitor relative to the reference voltage; and a reset signal generation section having:
a second current source connected in parallel with the second transistor to provide a third current; a second capacitor;
second switching circuitry connected to receive an inverted form of the pump clock signal and, based on the inverted form of the pump clock signal, alternately connect the second capacitor to charge and discharge at a rate based on the combined first and third currents; and
a second comparison circuit connected to the second capacitor and to the reference voltage, wherein the second comparison circuit generates a reset signal based on a voltage level on the second capacitor relative to the reference voltage; and
a latch connected to receive the set and reset signals and generate the pump clock signal therefrom.

17. The method of claim 13, wherein the supply current is supplied to the charge pump circuit through a first transistor, the method further comprising:
generating a regulation voltage signal from the output voltage potential; and
applying the regulation voltage signal to a control gate of a first transistor;
wherein the regulation voltage signal is generated by use of a feedback circuit, comprising:
a voltage divider circuit connected between an output node of the charge pump circuit and ground; and
an operational amplifier configured to output the regulation voltage signal, the operational amplifier having a first input connected to a node of the voltage divider circuit and a second input connected to receive a reference voltage signal.

18. The method of claim 13, wherein the method is performed by a charge pump system formed on a non-volatile memory circuit.

19. The method of claim 18, wherein the non-volatile memory circuit is a monolithic three-dimensional semiconductor memory device having memory cells arranged in multiple physical levels above a silicon substrate and that each include a charge storage medium.

20. A system, comprising:
means for mirroring a supply current to a charge pump, the charge pump configured to generate an output voltage potential on an output node by use of the supply current and a clock signal, wherein mirroring the supply current comprises generating a mirrored supply current having a magnitude that is a fraction of a magnitude of the supply current to the charge pump; and
means for producing the clock signal for the charge pump using the mirrored supply current, wherein a frequency of the clock signal corresponds to the magnitude of the mirrored supply current such that the frequency of the clock signal varies with the magnitude of the supply current to the charge pump.

21. The system of claim 20, wherein the supply current is supplied to the charge pump through a first transistor, and wherein a gate of the first transistor is controlled by a regulation signal, the system further comprising:
means for generating the regulation signal, wherein the regulation signal corresponds to the output voltage potential.

* * * * *